(12) United States Patent
Kim et al.

(10) Patent No.: US 6,928,098 B2
(45) Date of Patent: *Aug. 9, 2005

(54) HIGH FREQUENCY OPTICAL PULSE SOURCE

(75) Inventors: Dong-Churl Kim, Daejeon (KR);
Young-Ahn Leem, Daejeon (KR);
Dae-Su Yee, Daejeon (KR);
Kyung-Hyun Pakr, Daejeon (KR);
Sung-Bock Kim, Daejeon (KR);
Yong-Soon Baek, Daejeon (KR);
Eun-Deok Sim, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/632,587

(22) Filed: Jul. 31, 2003

(65) Prior Publication Data

US 2004/0114656 A1 Jun. 17, 2004

(30) Foreign Application Priority Data

Dec. 17, 2002 (KR) ................................ 10-2002-0080706

(51) Int. Cl.[7] .............................. H01S 5/00; H01S 3/08
(52) U.S. Cl. ........................................... 372/50; 372/96
(58) Field of Search ........................... 372/50, 96, 102, 372/27, 31

(56) References Cited

U.S. PATENT DOCUMENTS

| | | | | |
|---|---|---|---|---|
| 5,288,659 A | * | 2/1994 | Koch et al. .................... 438/31 |
| 5,648,978 A | * | 7/1997 | Sakata .......................... 372/50 |
| 5,841,799 A | * | 11/1998 | Hiroki .......................... 372/19 |
| 6,075,799 A | * | 6/2000 | Uchida et al. ................. 372/27 |
| 6,122,306 A | | 9/2000 | Sartorius et al. |
| 6,337,868 B1 | * | 1/2002 | Mizutani ....................... 372/27 |
| 6,526,075 B2 | * | 2/2003 | Mizutani ....................... 372/27 |
| 2002/0181518 A1 | * | 12/2002 | Mizutani ....................... 372/27 |

OTHER PUBLICATIONS

1994 IEEE, "High–Frequency Oscillations and Self–Mode Locking in Short External–Cavity Laser Diodes", A. Tager, et al., vol. 30, No. 7, Jul. 1994, pp. 1553–1561.
Electronic Letters, Mar. 28th 2002, vol. 38, No. 7, pp. 334–335, "Optical microwave source", S. Bauer, et al.

* cited by examiner

*Primary Examiner*—Don Wong
*Assistant Examiner*—Hung Tran Vy
(74) *Attorney, Agent, or Firm*—Blakely Sokoloff Taylor & Zafman

(57) ABSTRACT

Disclosed is a high frequency optical pulse source generating stable optical pulses over a wide current range in an optical transmission system to enhance stability and reliability, the high frequency optical pulse source implementing, in one chip, a multi-section distributed feedback (DFB) laser diode with a phase control section arranged between two DFB laser diodes. By controlling the current applied to the electrode of the phase control section while applying currents to the first and second DFB sections, the present invention causes self-mode locking between the compound-cavity modes having similar threshold currents, thereby generating stable tens GHz-level optical pulses. Hence, the present invention generates optical pulses uniformly over a wide current range, thereby enhancing the stability and reliability of the element.

5 Claims, 3 Drawing Sheets

HIGH FREQUENCY OPTICAL PULSE SOURCE

CROSS REFERENCE TO RELATED APPLICATION

This application is based on Korea Patent Application No. 2002-80706 filed on Dec. 17, 2002 in the Korean Intellectual Property Office, the content of which is incorporated herein by reference.

BACKGROUND OF THE INVENTION (a) Field of the Invention

The present invention relates to a pulse laser for regeneration of optical clock pulses that is suitable for 3R regeneration—retiming, reshaping, and reamplifying—to restore optical signals distorted while being transmitted via an optical cable. More specifically, the present invention relates to a high frequency optical pulse source capable of generating stable optical pulses using self mode locking in a multi-electrode distributed feedback laser diode.

(b) Description of the Related Art

The prior art of the pulse laser related to the present invention will now be described, as follows.

An element comprised of two active layers with a saturated absorption layer can generate optical pulses of approximately 5 GHz, but it is difficult to acquire faster optical pulses because the life time of carriers is limited to about 1 ns (Ref. 1: P. E. Barnsley, IEE Proc. J, vol. 140, 1993).

As a multi-electrode distributed feedback pulse laser that has recently been proposed in an attempt to overcome the problem, a two-electrode distributed feedback laser can generate GHz-level optical pulses by regulating input currents of electrodes (Ref. 2: M. Mohrle, IEEE, Phtonics Technol. Lett. Vol. 4, 1992). But this laser system generates optical pulses limited to 15 GHz, and it requires a phase control section integrated on the element for the purpose of guaranteeing high repeatability and controllability, because the phase of gratings varies at random from element to element in a two-electrode distributed feedback (DFB) laser.

In another example, optical pulse generation and injection locking in a section of greater than 40 GHz is carried out using beats in an element with a phase control section integrated therein (Ref. 5: M. Mohrle, IEEE J. Quantum. Electron. Lett. Vol. 7, 2001).

Contrarily, a laser diode with incident light output from an external resonator can generate two compound-cavity modes and achieve self mode locking by the contention of these modes (Ref. 6: A. A. Tager et al., IEEE J. Quantum. Electron. Lett. 30, 1994).

The latest technology relates to optical pulse generation from an optical element that includes, in one chip, a distributed feedback semiconductor laser diode, a phase control section, and an amplifier having a cleaved section without a non-reflecting coating (Ref. 7: S. Bauer et al., IEEE J. Quantum. Electron. Lett. 38, 2002).

However, the above-mentioned technologies tend to cause mode hopping or multiple modes in DFB laser section according to the phase change in actual applications, adversely affecting the generation of optical pulses and a stable frequency change.

SUMMARY OF THE INVENTION

It is an advantage of the present invention to provide a high frequency optical pulse source using self mode locking that has a structure showing a stable phase without mode hopping or turning to multiple modes, even with a change of the phase.

In one aspect of the present invention, there is provided a high frequency optical pulse source using self mode locking that includes, in one element, two DFB sections opposed to each other, and a phase control section between the two DFB sections. The high frequency optical pulse source further includes symmetrically formed gratings inside the DFB sections, underlying and overlying the active layers of both DFB sections, the active layers being associated with both sides of a waveguide core of the phase control section, thereby allowing Bragg wavelength detuning of the both DFB sections.

In the above structure, the gratings positioned inside both DFB sections are independently formed in a symmetrical way to each other underlying and overlying the active layers, thereby allowing independent Bragg wavelength detuning.

The gratings positioned inside both DFB sections are also independently formed on a same plane overlying or underlying the active layers, thereby allowing independent Bragg wavelength detuning.

The gratings positioned inside the both DFB sections are formed by holography or e-beams.

Both interfaces between the DFB and a phase section are formed by butt coupling or evanescent coupling.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

Hereinafter, the preferred embodiment of the present invention will be described in detail with reference to the accompanying drawings.

Figure 1:
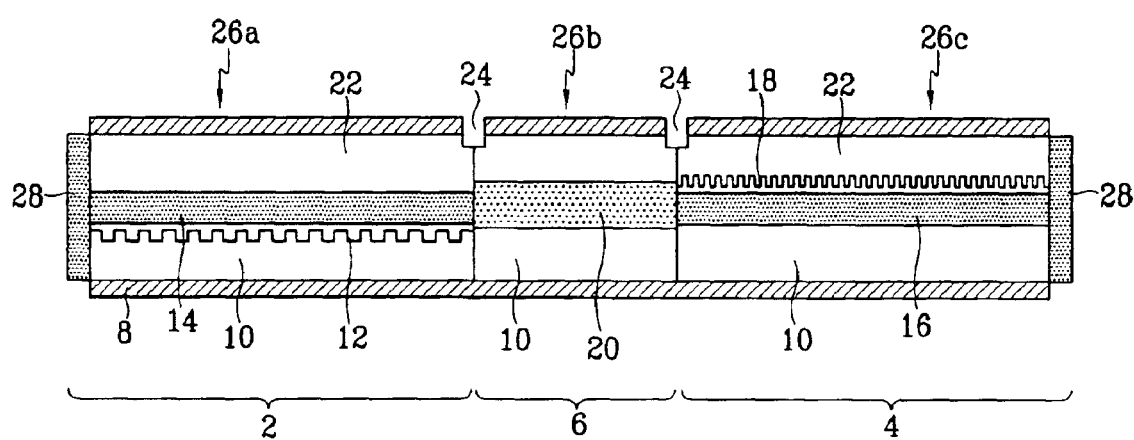
FIG. 1 is a cross-sectional view of a high speed optical pulse apparatus according to the present invention.

The present invention comprises, as shown in FIG. 1, a phase control section 6 arranged between two DFB sections 2 and 4 opposed to each other. These sections 2, 4, and 6 are integrated on one n-clad substrate 10 having an underlying base electrode 8.

The first DFB section 2 has a first grating 12 formed inside the n-clad substrate 10, and a first active layer 14 on the first grating 12. The second DFB section 4 has a second active layer 16, and a second grating 18. Being symmetrical to the first DFB section 2, the second DFB section 4 has the second grating 18 disposed on the second active layer 16, and thereby detuning the Bragg wavelength of both DFB sections is possible. Here, the first and second gratings 12 and 18 are formed by holography or e-beams, and two interfaces between the first and second DFB sections 2 and 4 can be of a butt-coupling type or an evanescent-coupling type.

The phase control section 6 has a waveguide core 20 formed between the first and second active layers 14 and 16. A p-clad layer 22 is disposed on the active layer 14 of the first DFB section 2, the grating 18 of the second DFB section 4, and the waveguide core 20 of the phase control section 6. On the p-clad layer 22 are formed electrodes 26a, 26b, and 26c, isolated from one another by grooves 24 that separate the sections 2, 4, and 6.

Both side ends of the present invention apparatus as constructed above, i.e., laser beam input/output sections, are coated with a anti-reflection thin film 28.

The above-constructed present invention apparatus, which has the phase control section between two DFB laser diodes, generates compound-cavity modes when applying both a current higher than a threshold current to the electrode 26a of the first DFB section 2, and a current less than the threshold current or the higher to the electrode 26c of the second DFB section 4, causing self-mode locking among the compound-cavity modes having similar threshold currents. In the compound-cavity modes thus acquired, the current applied through the electrode 26b of the phase control section 6 is regulated to vary the refractive index and thereby to output stable optical pulses of several tens GHz.

Figure 2:
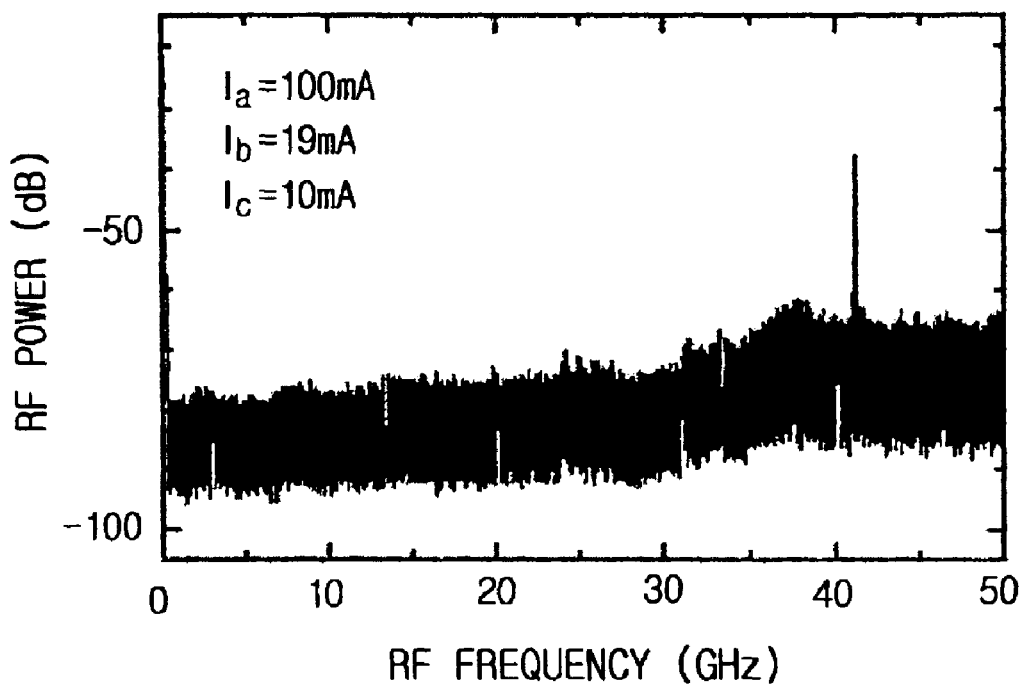
FIG. 2 is a graph showing RF frequency characteristics of optical pulses measured at the apparatus of the present invention.

FIG. 2 is a graph showing the RF frequency characteristics of the optical pulse measured at the present invention apparatus, in which Ia (100 mA) represents the current applied to the first DFB section 2, Ib (19 mA) represents the current applied to the second DFB section 4, and Ic (10 mA) represents the current applied to the phase control section 6. The optical pulse thus obtained is passed through a photodetector to provide an RF spectrum, which shows that the optical pulse is of a 40-GHz level.

Figure 3:
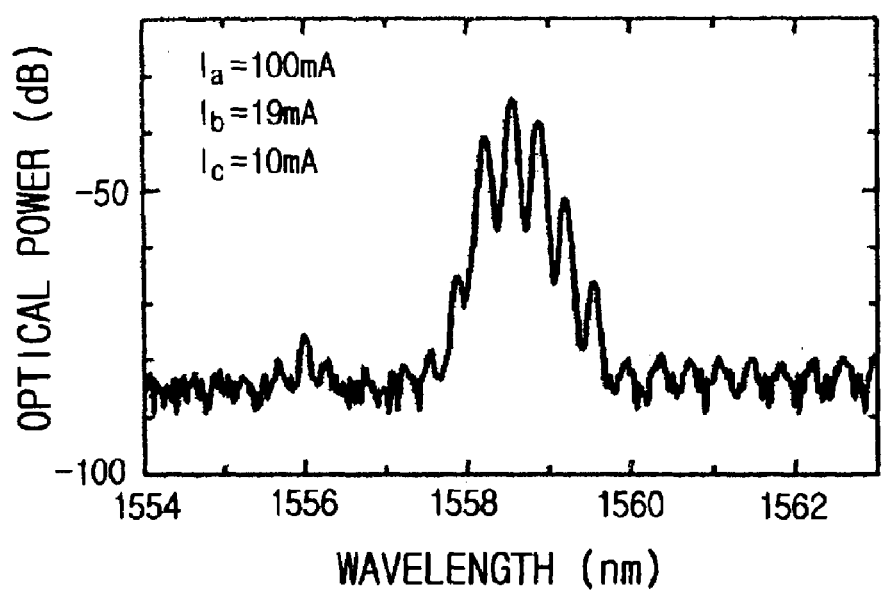
FIG. 3 is an optical spectrum related to the optical pulses of FIG. 2.

The optical spectrum of the optical pulse, induced from the measurements of FIG. 3, shows that all the mode intervals are matched to the peak frequencies on the RF spectrum.

Figure 4:
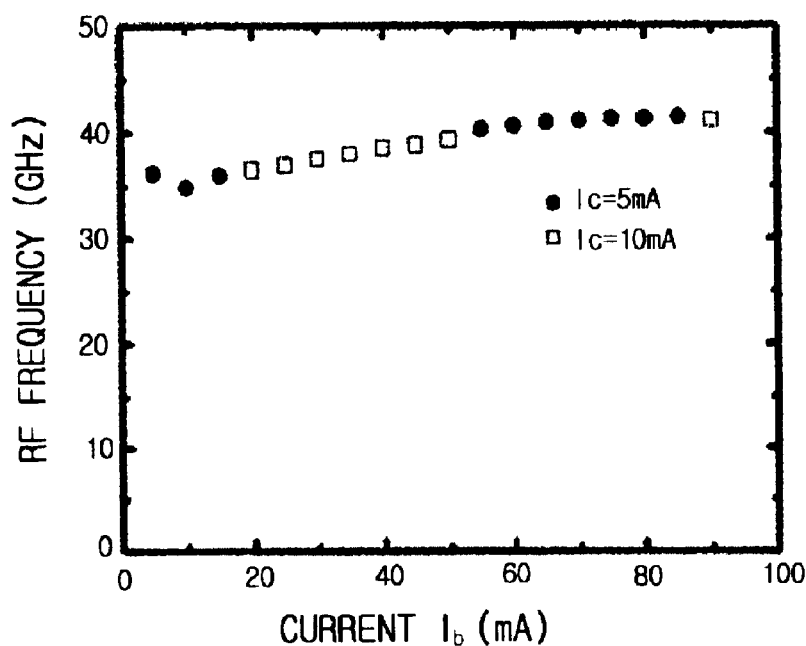
FIG. 4 is a graph showing the relationship of the optical pulse frequency according to variations of the current applied.

FIG. 4 shows the frequency measurement of the self-mode-locked pulse as a function of the current Ib applied to the second DFB section 4 when the current Ia applied to the first DFB section 2 is 100 mA and the current Ic applied to the phase control section 6 is 10 mA and 5 mA. It can be seen that a pulse of about 40 GHz is stably outputted when the current Ib applied to the second DFB section 4 is in the range from 10 to 90 mA.

Figure 5:
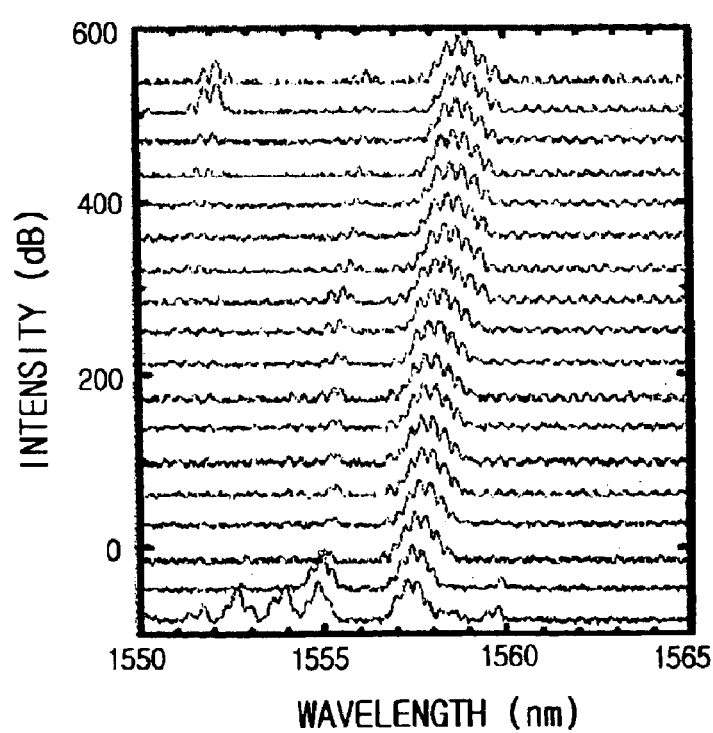
FIG. 5 is an optical spectrum according to variations of the current applied.

FIG. 5 shows the optical spectrum of FIG. 4 as a function of the applied current Ib. It can be seen that a self-mode-locked spectrum having 4 to 6 peaks is obtained.

As described above, the present invention implements a multi-section DFB laser diode in the form of one chip with the phase control section arranged between two DFB laser diodes. By controlling the current applied to the electrode of the phase control section while applying currents to the first and second DFB sections, the present invention causes mode locking among the compound-cavity modes having similar threshold currents, thereby generating stable several tens GHz-level optical pulses. Hence, the present invention generates optical pulses uniformly over a wide current range, thereby enhancing the stability and reliability of the element.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A high frequency optical pulse source using self-mode locking comprising:

a phase control section disposed between a first distributed feedback (DFB) section and a second DFB section;

a first grating formed under an active layer of the first DFB section; and a second grating formed over an active layer of the second DFB section;

wherein the active layers of both DFB sections are associated with both sides of a waveguide core of the phase control section.

2. The high frequency optical pulse source as claimed in claim 1, wherein the gratings positioned inside both DFB sections are independently formed in a symmetrical way to each other, underlying and overlying the active layers, thereby allowing independent Bragg wavelength detuning.

3. The high frequency optical pulse source as claimed in claim 1, wherein the gratings positioned inside both DFB sections are independently formed on the same plane overlying or underlying the active layers, thereby allowing independent Bragg wavelength detuning.

4. The high frequency optical pulse source as claimed in claim 1, wherein the gratings positioned inside both DFB sections are formed by holography or e-beams.

5. The high frequency optical pulse source as claimed in claim 1, wherein both DFB sections are formed by butt coupling or evanescent coupling.

* * * * *